(12) United States Patent
Chang

(10) Patent No.: US 6,303,421 B1
(45) Date of Patent: Oct. 16, 2001

(54) METHOD OF MANUFACTURING CMOS SENSOR

(75) Inventor: Kuang-Yeh Chang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/617,565

(22) Filed: Jul. 17, 2000

(51) Int. Cl.⁷ ................. H01L 21/8238; H01L 21/00
(52) U.S. Cl. ............... 438/228; 438/75; 438/223; 257/345
(58) Field of Search ................. 438/228, 221, 438/222, 75, 223; 257/345

(56) References Cited

U.S. PATENT DOCUMENTS

| | | | |
|---|---|---|---|
| 5,405,791 | * 4/1995 | Ahmad et al. | 438/228 |
| 5,489,546 | * 2/1996 | Ahmad et al. | 438/248 |
| 5,654,213 | * 8/1997 | Choi et al. | 438/227 |
| 5,698,884 | * 12/1997 | Dennen | 257/345 |
| 5,929,493 | * 7/1999 | Wu | 438/228 |
| 5,966,599 | * 10/1999 | Walker et al. | 438/228 |

FOREIGN PATENT DOCUMENTS

| | | | |
|---|---|---|---|
| 019939244A1 | * 8/1999 | (DE) | H01L/21/8238 |
| 0244607-A1 | * 3/1987 | (EP) | H01L/29/08 |
| 0253741-A1 | * 7/1987 | (EP) | H01L/21/82 |

* cited by examiner

*Primary Examiner*—Charles Bowers
*Assistant Examiner*—David S Blum
(74) *Attorney, Agent, or Firm*—Thomas, Kayden, Horstemeyer & Risley, LLP

(57) ABSTRACT

A method for manufacturing a CMOS sensor comprises the steps of providing a substrate having a first conductive type, wherein the substrate comprises an isolation region, an active region, a gate structure on the active region and a source/drain region having a second conductive type in the substrate. A patterned photoresist is formed over the substrate. A first doped region having the second conductive type is formed across a portion of the source/drain region and extends from the surface of the substrate into the substrate. A second doped region having the first conductive type is formed to wrap the first doped region in the substrate. A third doped region having the second conductive type is formed under the second doped region. A fourth doped region having the first conductive type is formed under the third doped region. The patterned photoresist is removed.

16 Claims, 2 Drawing Sheets

METHOD OF MANUFACTURING CMOS SENSOR

BACKGROUND OF THE INVENTION

1. Field of the Invention

The present invention relates to a method for manufacturing a complementary metal-oxide semiconductor (CMOS) sensor. More particularly, the present invention relates to a multiple implantation method for manufacturing a CMOS sensor.

2. Description of the Related Art

Charge-coupled devices (CCDs) have been the mainstay of conventional imaging circuits for converting light into an electrical signal that represents the intensity of the energy. The applications of the CCDs include monitors, transcription machines and cameras. Although CCDs have many strengths, CCDs also suffer from high costs and the limitation of the CCDs' volume. To overcome the weaknesses of CCDs and reduce costs and dimension, a CMOS photodiode device is developed. Because a CMOS photodiode device can be produced using conventional techniques, costs and the volume of the sensor can be reduced. The applications of CMOS photodiodes include PC cameras, digital cameras etc.

The photodiode is based on the theory that a P-N junction can convert light into an electrical signal. Before energy in the form of photons strikes the photodiode, there is an electric field in the P-N junction. The electrons in N region do not diffuse forward to P region and the holes in P region do not diffuse forward to N region. When enough light strikes the photodiode, the light creates a number of electron-hole pairs. The electrons and the holes diffuse forward to the P-N junction. While the electrons and the holes reach the P-N junction as a result of the effect of the inner electric field across the junction, the electrons flow to the N region and the holes flow to the P region. Thus a current is induced between the P-N junction electrodes. Ideally, a photodiode in the dark is open-circuit. In other words there is no current induced by light while the photodiode is in the dark.

FIG. 1A is a circuit diagram of a CMOS sensor. FIG. 1B is a layout of the sensor cell C in the FIG. 1A.

As shown in FIG. 1A, the sensor array used in the CMOS sensor is improved from a passive pixel sensor array to an active pixel sensor array. The CMOS having the active pixel sensor array cell includes at least three transistors Q1, Q2, Q3 and a photodiode D. The reset transistor Q1 is used to receive a reset signal A. The gate of the row access transistor Q3 is used to receive a row access signal B. One of the source/drain regions of the transistor Q1 is electrically coupled to the source voltage $V_{DD}$. One of the source/drain regions of the transistor Q2 is electrically coupled to the source voltage $V_{DD}$. One of the source/drain regions of the transistor Q3 is electrically coupled to the output. The sensor cell C comprises the transistor Q1 and the photodiode D. The photodiode D can convert light into an electrical signal by using the P-N junction and the electrical signal is transferred to the transistor Q1.

As shown in FIG. 1B, the sensor cell C comprises the transistor Q1 and the photodiode D. The transistor Q1 comprises a gate structure 106, source/drain regions 108 and 118 adjacent to the gate structure 106 in the substrate. The photodiode D is adjacent to the source/drain region 118 in the substrate.

The characteristic of the sensor cell is immediately relative to the concentration, the deepness and the profile of the dopants. In other words, the characteristic of the sensor cell is relative to the dose, the energy and the area coverage of the ion implantation over the sensor region.

Generally, the sensor cell is relative to the nature of the sensor region. The factors which can affect the characteristics of the sensor cell include the following:

1. The leakage current of the sensor cell caused by a defect present at the boundary between the sensor and the isolation region and the plasma damage induced by the ion implantation step;
2. The gain of the sensor cell determined by the range of the deletion region of the P-N junction, wherein the larger the range of the depletion region is, the larger the gain is;
3. The slew rate of the sensor cell determined by the deepness of the P-N junction, wherein the shallower the depth of the P-N junction is, the faster the slew rate is;
4. The uniformity of the sensor relative to the processes for manufacturing a CMOS sensor and the parameters of the sensor and the transistor; and
5. The quantum efficiency of the sensor cell determined by the minority carrier in the depletion region of the P-N junction.

FIG. 1C is a schematic, cross-sectional view of the conventional CMOS sensor referred to in FIG. 1B.

An isolation region 102 such as a field oxide layer is formed on the substrate 100 to define the active region for the subsequently formed CMOS sensor. A gate oxide layer 104 is formed, for example, by the thermal oxidation on a portion of the substrate 100 exposed by the isolation region 102. An ion implantation step is used to formed lightly doped drain regions which have N-type dopants in portions of the substrate 100 exposed by the gate conductive layer 106 and the isolation region 102. A spacer 122 is formed on the sidewall of the gate conductive layer 106. An ion implantation step is used to formed heavily doped regions having N-type dopants in portions of the substrate 100 exposed by the gate conductive layer 106, the spacer 122 and the isolation region 102. Source/drain regions 108 and 118 include the heavily doped regions and the lightly doped drain regions. A patterned photoresist (not shown) is formed over the substrate 100 to expose the region for the subsequently formed sensor region. An implantation step with low energy and a high implanting dose is performed to form a sensor region 128, which is an N-type doped region, across a portion of the source/drain region 118 and extending from the surface of the substrate 100 into the substrate 100.

Since the P-N junction exists at the boundary between the sensor region 128 and the substrate 100, a number of electron-hole pairs are created as the incident light strikes the P-N junction. Therefore, the incident light is converted into electrical signal.

Because the sensor region 128 is formed by performing one implantation step with low energy and a high implanting dose, the leakage usually occurs at the boundary between the sensor region 128 and the isolation region 102 and the performance of the P-N junction can not be optimized.

SUMMARY OF THE INVENTION

It is therefore an objective of the invention to provide a method of manufacturing a CMOS sensor. The invention can overcome the problem of leakage and optimize the efficiency of the sensor.

To achieve these and other advantages and in accordance with the purpose of the invention, as embodied and broadly described herein, the invention provides a method for manufacturing a CMOS sensor. The method comprises the steps of providing a substrate having a first conductive type, wherein the substrate comprises an isolation region, an active region, a gate structure on the active region and a source/drain region having a second conductive type in the substrate. A patterned photoresist is formed over the substrate. A first doped region having the first conductive type is formed along the end of the isolation region in a portion of the substrate between the isolation region and the source/drain region. A second doped region having the second conductive type is formed across a portion of the source/drain region and extends from the surface of the substrate into the substrate. A third doped region having the second conductive type is formed under the second doped region. A fourth doped region having the first conductive type is formed under the third doped region. The patterned photoresist is removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
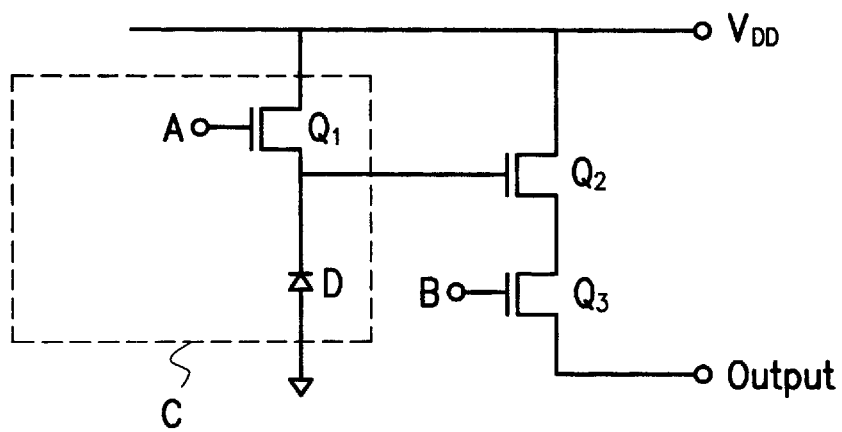
FIG. 1A is a circuit diagram of CMOS sensor.
Figure 1B:
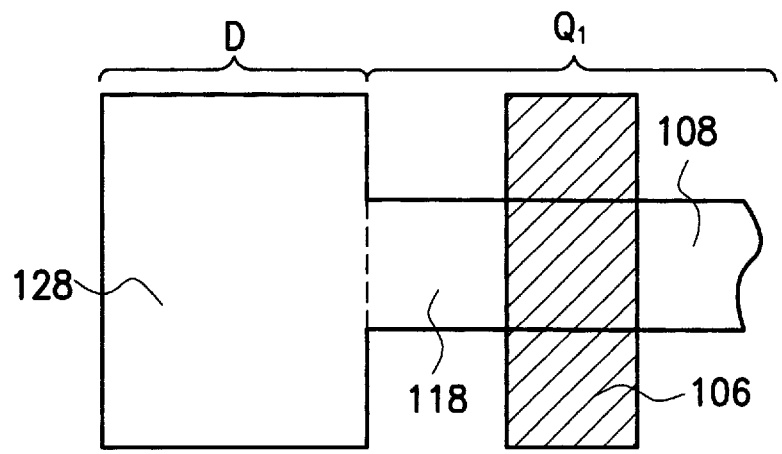
FIG. 1B is a layout of the sensor cell C in the FIG. 1A.
Figure 1C:
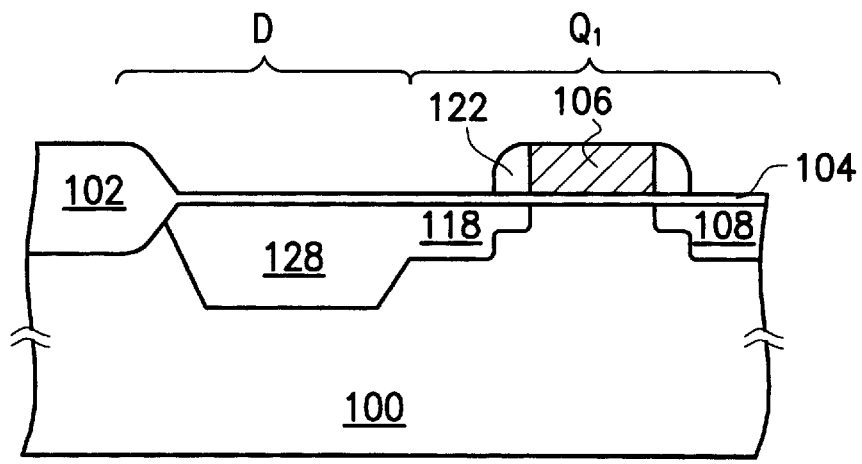
FIG. 1C is a schematic, cross-sectional view of the conventional CMOS sensor referred to the FIG. 1B.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
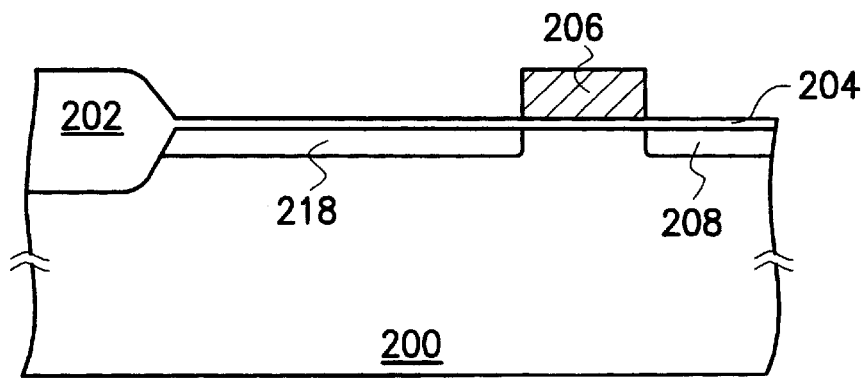
FIGS. 2A through 2C are schematic, cross-sectional views of process for manufacturing the CMOS sensor in a preferred embodiment according to the invention.
Figure 2B:
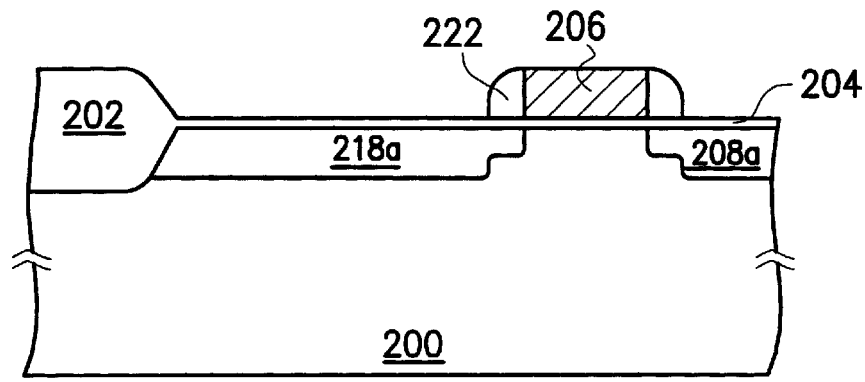
Figure 2C:
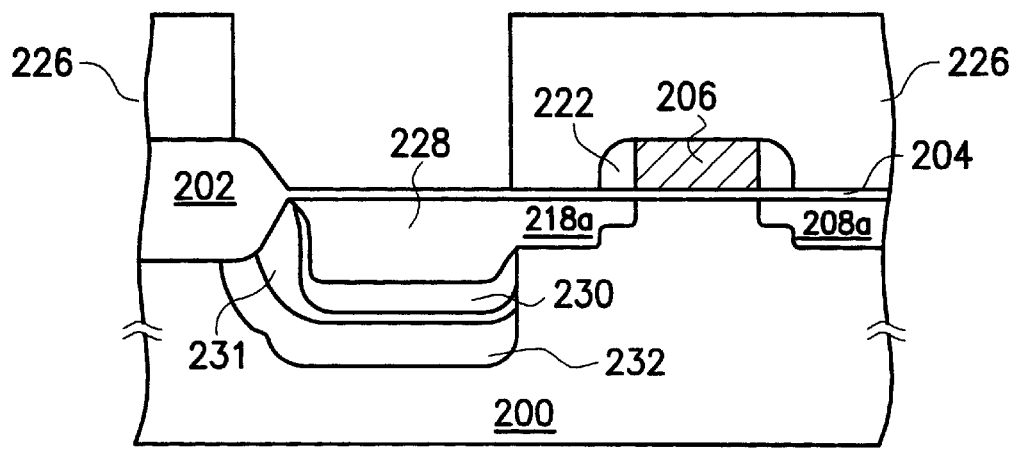

FIGS. 2A through 2C are schematic, cross-sectional views of the process for manufacturing the CMOS sensor in a preferred embodiment according to the invention.

First, as shown in FIG. 2A, an isolation region 202 such as field oxide layer is formed on the substrate 200 to define the active region for the subsequently formed CMOS sensor. The substrate 200 can be a P-type substrate or a P-type well. A gate oxide layer 204 is formed, for example, by the thermal oxidation on a portion of the substrate 200 exposed by the isolation region 202. A gate conductive layer 206 is formed on the gate oxide layer 204. The gate conductive layer 206 and the portion of the gate oxide layer beneath the gate conductive layer 206 are called a gate structure. The steps of forming the gate conductive layer 206 comprise forming a doped polysilicon layer on the gate oxide layer 204 and forming a silicide layer such as tungsten silicon, titanium silicon or molybdenum silicon on the doped polysilicon layer. The doped polysilicon layer of the gate conductive layer 206 can be formed by low-pressure chemical deposition, for example. The dopants in the doped polysilicon layer can be arsenic ions or phosphorus ions, for example. An ion implantation step is used to formed lightly doped drain regions 208 and 218 which have N-type dopants in portions of the substrate 200 exposed by the gate conductive layer 206 and the isolation region 202.

As shown in FIG. 2B, a spacer 222 is formed on the sidewall of the gate conductive layer 206. In this example, the steps of forming the spacer 222 comprise conformally forming an insulator layer such as a silicon oxide layer or a silicon nitride layer over the substrate 200 by chemical vapor deposition and performing a anisotropic etching to exposed a portion of the doped drain regions 208 and 218. An ion implantation step is used to formed heavily doped regions having N-type dopants in portions of the substrate 200 exposed by the gate conductive layer 206, the spacer 222 and the isolation region 202. Source/drain regions 208a and 218a include the heavily doped regions and the lightly doped drain regions 208 and 218.

As shown in FIG. 2C, an $N^+$ doped region is formed across a portion of the source/drain region 218a and extends from the surface of the substrate 200 into the substrate 200, wherein the $N^+$ doped region is a sensor region 228. An $N^-$ doped region 230 is formed under the sensor region 228 in the substrate 200, wherein the $N^-$ doped region indicates that the dopant concentration of the $N^-$ doped region is lighter than that of the $N^+$ doped region. A $P^-$ doped region 231 is formed to wrap the sensor region 228 and to isolate the sensor region 228 from the isolation region 202. A $P^-$ doped region 232 is formed under the $P^-$ doped region 231 in the substrate 200.

In this example, the method of forming the four doped regions mentioned above comprise forming a patterned photoresist 226 on the substrate 200 to exposed the region for the subsequently formed four doped regions. An ion implantation step is performed to form the sensor region 228 having a shallow junction. The dopants can be arsenic ions, for example, with an implantation energy of about 30 Kev and an implantation dose of about $1 \times 10^{13}$–$5.0 \times 10^{16}/cm^2$. The sensor region 228 has low sheet resistance and a shallow junction, so that the slew rate of the sensor region 228 is fast.

With the same patterned photoresist 226, an ion implantation step is performed to form the $P^-$ doped region 231. The dopants can be boron ions, for example, with an implantation energy of about 30 Kev and an implantation dose of about $1 \times 10^{12}$–$5.0 \times 10^{13}/cm^2$. Because of the compensation of the $P^-$ doped region 231 near the end of the isolation region 202, a portion of the sensor region 228 near the end of the isolation region 202 is disappeared and the $P^-$ doped region 231 isolate the sensor region 228 from the isolation region 202. The $P^-$ doped region 231 can prevent the CMOS sensor from leaking.

An ion implantation step is performed to form the $N^-$ doped region 230 between the sensor region 228 and the $P^-$ doped region 231 by using the same patterned photoresist 226. The dopants can be phosphorus ions, for example, with an implantation energy of about 50 Kev and an implantation dose of about $1 \times 10^{12}$–$5.0 \times 10^{13}/cm^2$. Because of the compensation of the sensor region 228 and the $N^-$ doped region 230, a portion of the $P^-$ doped region 231 under the $N^-$ doped region 230 is relatively narrow even disappeared.

Additionally, there is a tapered junction between the $N^{31}$ doped region 230 and the substrate 200. The tapered junction can increase the range of the depletion region, so that the gain of the sensor region 228 is increased.

An ion implantation step is performed to form the $P^-$ doped region 232 under the $P^-$ doped region 231. The dopants can be boron ions, for example, with an implantation energy of about 100 Kev and an implantation dose of about $1\times10^{12}$–$5.0\times10^{3}$/cm$^2$. The P$^-$ doped region 232 can optimize the background profile and decrease the resistance by providing a retrograde profile. The patterned photoresist 226 is removed.

Moreover, a CMOS sensor in the invention can also be obtained by interchanging P for N and N for P.

Altogether, the advantages of the present invention include the following:

1. The invention uses multiple implantation to form four different doped regions by using the same photoresist. It can overcome the problem of leakage and optimize the efficiency of the sensor.
2. The present invention and the conventional process techniques are compatible; thus the present invention is suitable for the use by manufacturers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a CMOS sensor, comprising the steps of:

providing a substrate having a first conductive type, wherein the first conductive substrate comprises an isolation region and an active region;

forming a gate structure on the active region;

forming a lightly doped drain region having a second conductive type in the substrate exposed by the gate structure and the isolation region;

forming a spacer on the sidewall of the gate structure;

forming a heavily doped region having a second conductive type in the substrate exposed by the gate structure, the spacer and the isolation region, wherein the lightly doped drain region and the heavily doped region constitute a source/drain region;

forming a patterned photoresist over the substrate to expose a portion of the source/drain region between the spacer and the isolation region;

forming a first doped region having the second conductive type across a portion of the source/drain region and extending from the surface of the substrate into the substrate;

forming a second doped region having the first conductive type to wrap the first doped region and to isolate the first doped region from the isolation region;

forming a third doped region having the second conductive type between the first doped region and the second doped region, wherein a portion of the second doped region is compensated by the first and the third doped regions;

forming a fourth doped region having the first conductive type under the second doped region; and removing the patterned photoresist.

2. The method of claim 1, wherein the isolation region includes a field oxide layer.

3. The method of claim 1, further comprising, between the step of providing a substrate and the step of forming a gate structure, a step of forming a gate oxide layer on a portion of the substrate exposed by the isolation region.

4. The method of claim 1, wherein material of the spacer is selected from the group consisting of silicon oxide and silicon nitride.

5. The method of claim 1, wherein the second doped region includes a P$^-$ doped region formed by implanting boron ions with an implantation energy of about 30 Kev and an implantation dose of about $1\times10^{12}$–$5.0\times10^{13}$/cm$^2$.

6. The method of claim 1, wherein the first doped region includes an N$^+$ doped region formed by implanting arsenic ions in the conditions that a energy of the ion implantation of about 30 Kev and a dose of the implanting dopants of about $1\times10^{13}$–$5.0\times10^{16}$/cm$^2$.

7. The method of claim 1, wherein the third doped region includes an N$^-$ doped region formed by implanting phosphorus ions with an implantation energy of about 50 Kev and an implantation dose of about $1\times10^{12}$–$5.0\times10^{13}$/cm$^2$.

8. The method of claim 1, wherein the fourth doped region includes a P$^-$ doped region formed by implanting boron ions with an implantation energy of about 100 Kev and an implantation dose of of about $1\times10^{12}$–$5.0\times10^{13}$/cm$^2$.

9. A method of manufacturing a CMOS sensor, comprising the steps of:

providing a substrate having a first conductive type, wherein the substrate comprises an isolation region, an active region, a gate structure on the active region and a source/drain region having a second conductive type in the substrate;

forming a patterned photoresist over the substrate to expose a portion of the source/drain region between the spacer and the isolation region;

forming a first doped region having the second conductive type across a portion of the source/drain region and extending from the surface of th e substrate into the substrate;

forming a second doped region having the first conductive type to wrap the first doped region and to isolate the first doped region from the isolation region;

forming a third doped region having the second conductive type under the second doped region;

forming a fourth doped region having the first conductive type under the third doped region; and removing the patterned photoresist.

10. The method of claim 9, wherein the isolation region includes a field oxide layer.

11. The method of claim 9, wherein the method of forming the source/drain region further comprises:

forming a lightly doped drain region having a second conductive type in the substrate exposed by the gate structure and the isolation region;

forming a spacer on the sidewall of the gate structure; and forming a heavily doped region having a second conductive type in the substrate exposed by the gate structure, the spacer and the isolation region, wherein the lightly doped drain region and the heavily doped region constitute a source/drain region.

12. The method of claim 9, wherein material of the spacer is selected from the group consisting of silicon oxide and silicon nitride.

13. The method of claim 9, wherein the second doped region includes a P$^-$ doped region formed by implanting boron ions with an implantation energy of about 30 Kev and an implantation dose of about $1\times10^{12}$–$5.0\times10^{13}$/cm$^2$.

14. The method of claim 9, wherein the first doped region includes an N$^+$ doped region formed by implanting arsenic ions in the conditions that a energy of the ion implantation of about 30 Kev and a dose of the implanting dopants of about $1\times10^{13}$–$5.0\times10^{16}$/cm$^2$.

15. The method of claim 9, wherein the third doped region includes an N$^-$ doped region formed by implanting phosphorus ions with an implantation energy of about 50 Kev and an implantation dose of about $1\times10^{12}$–$5.0\times10^{13}$/cm$^2$.

16. The method of claim 9, wherein the fourth doped region includes a P$^-$ doped region formed by implanting boron ions with an implantation energy of about 100 Kev and an implantation dose of about $1\times10^{12}$–$5.0\times10^{13}$/cm$^2$.

* * * * *